United States Patent [19]
Raymond

[11] Patent Number: 5,880,591
[45] Date of Patent: Mar. 9, 1999

[54] SYSTEM FOR CIRCUIT MODULES HAVING A PLURALITY OF INDEPENDENTLY POSITIONABLE PROBES

[75] Inventor: Douglas W. Raymond, Orinda, Calif.

[73] Assignee: Teradyne, Inc., Boston, Mass.

[21] Appl. No.: 634,749

[22] Filed: Apr. 16, 1996

[51] Int. Cl.$^6$ .................................................. G01R 31/02
[52] U.S. Cl. .......................................... 324/758; 324/754
[58] Field of Search .................................... 324/754, 755, 324/758, 765, 158.1, 73.1; 439/62, 68, 70, 182; 438/14, 17

[56] References Cited

U.S. PATENT DOCUMENTS

| | | | |
|---|---|---|---|
| 3,453,545 | 7/1969 | Oates | 324/754 |
| 3,963,985 | 6/1976 | Geldermans | 324/754 |
| 3,968,433 | 7/1976 | Dobarganes | 324/754 |
| 4,804,132 | 2/1989 | Difrancesco | 228/115 |
| 5,015,946 | 5/1991 | Janko | 324/754 |
| 5,083,697 | 1/1992 | Difrancesco | 228/116 |
| 5,177,436 | 1/1993 | Lee | 324/754 |
| 5,276,345 | 1/1994 | Malloy | 324/761 |
| 5,479,105 | 12/1995 | Kim et al. | 324/755 |
| 5,497,103 | 3/1996 | Ebert et al. | 324/754 |
| 5,506,510 | 4/1996 | Blumenau | 324/754 |

OTHER PUBLICATIONS

*Probing at Die Level*, Advanced Packaging, Jan./Feb. 1995 pp. 26–28 by A.E. Corwith.
*Particle Interconnect*, Exatron, 4 Pages (Unavailable Date).
*The Economics of Automatic Testing*, pp. 76–99 by Brendan Davis (Unavailable Date).
*Spring Contact Probes*, Everett Charles Technologies, pp. 6–9 (Unavailable Date).
*Electrical Testing of Multichip Modules*, Multichip Module Technologies And Alternatives, pp. 615–795 by Thomas C. Russell and Yenting Wen, (Unavailable Date).

*Primary Examiner*—Vinh P. Nguyen
*Attorney, Agent, or Firm*—Edmund J. Walsh

[57] ABSTRACT

A test system for multi-chip modules. Test points on the multi-chip modules are brought to the perimeter of the modules for easy access. The test points are grouped in arrays with an associated alignment post. The multi-chip module is probed with several independently positionable probes, each one of which can be independently aligned with one of the arrays of test points. Independent alignment of the test probes relaxes tolerances on the test points needed to ensure proper contact between the test pints and the probes. As a result, the test points can be made very small, thereby reducing the amount of the multi-chip module dedicated for testing. In the preferred embodiment, the probes are made using flex circuits.

17 Claims, 2 Drawing Sheets

SYSTEM FOR CIRCUIT MODULES HAVING A PLURALITY OF INDEPENDENTLY POSITIONABLE PROBES

This invention relates generally to automatic test equipment and more specifically to testing multi-chip modules.

Traditionally, electronic devices have been manufactured using printed circuit boards. Components are attached to printed circuit boards by soldering leads of the components to the boards. In traditional one-sided through-hole construction, the components are mounted on the top side of the board. The conductive leads extend through holes in the board and are soldered on the bottom side of the board.

To test the printed circuit board, test signals are applied at various points on the board and measurements are made at other points. The points at which these signals are applied or measured are called "nodes" or "test pads."

Because a conventional through-hole printed circuit board has the leads of the components exposed on the bottom of the board, there are many nodes for testing on the bottom of the board. The nodes might be the solder attaching the leads to the board or the ends of metal component leads protruding from their surrounding solder fillets. Alternatively, the nodes could be conductive pads added to the underside of the board just to provide test access to specific points on the printed circuit board.

Access to the nodes is made through a "bed of nails" fixture. The bed of nails consists of numerous spring mounted pins attached to a fixture in a pattern to line up with the nodes on the bottom of the board. The printed circuit board is placed in the fixture and pressed down onto the bed of nails and the spring probes make contact with the nodes. The board is often pressed down by drawing a vacuum in the fixture under the board. However, other means of pressing the board down are often employed, such as over clamp fixtures.

Recent advancements in manufacturing process have made it more difficult to get access to nodes for testing. One such advancement is the use of surface mount technology. Surface mount components do not have long leads. In surface mount construction, component leads are soldered to metal pads on the surface of the board, rather than being inserted into holes drilled through the board. Because the pads can be made on a finer pitch than holes can be drilled through the board, surface mount components can be used to provide smaller boards.

To gain even greater density, surface mount boards can be designed with components on both sides. Such an arrangement complicates access to the board for testing because the components on the bottom side of the board occupy the area that might otherwise be used for test pads.

To access nodes on surface mount boards for testing, separate pads are sometimes made on the upper surface of the board at various test points. The board is then mounted in a bed of nails fixture with the top of the board facing the bed of nails. Sometimes, a special fixture is made to contact test pads on both sides of the board simultaneously.

An extension of the surface mount concept is called a multi-chip module, or MCM. An MCM is designed to have many components in a very small space. These components are the "chips" that are used to make electronic components. In a conventional electronic component, a single chip is usually placed in a package. Leads extending from the package are connected to the chip. Much of the volume of a conventional electronic component is actually occupied by the package. In a conventional assembly, much area is taken up by the interconnection of the leads of packages.

A MCM is smaller because it is a single packaged subassembly containing a plurality of "chips" on a substrate. The chips may be semiconductor integrated circuits (IC's), chip resistors, chip capacitors and the like. Wiring embedded in the substrate makes interconnections among the chips. Multi-chip modules are, in effect, subminiature surface-mount assemblies. Each MCM consists of a substrate, which is functionally equivalent to a circuit board, on which components are mounted to top side and bottom side, or top side alone. Reduction in size comes about by elimination of packaging around each chip and interconnection between packages.

A completed MCM, once tested and packaged, is generally treated as an integral component, which will be in turn soldered to a larger circuit board along with other components. However, some MCM's contain an entire electronic product. Such MCMs need only be combined with a connector, a heat sink and an enclosure to form a complete product.

MCM's are called for in several instances. They are used when semiconductor devices made by different processes are needed in a single package. For example, a high speed graphics processor unit generally requires digital logic, memory, and linear analog circuitry. While all these elements can be made with current semiconductor processes, they are made by different processes, making it very difficult to make all these elements on a single chip.

MCMs are also used when a single chip can not hold all of the circuitry needed to make a part, but the application requires a single part. For example, very large gate array parts are made by incorporating several gate array chips into an MCM.

MCM's are also used when space or weight restrictions do not allow a conventional through hole or surface mount assembly constricted of ordinary packaged components. For example, electronic ignition controls for small gasoline engines are sometimes made with MCMs.

An MCM, like a circuit board, has components which are interconnected by means of wiring embedded in or printed on a substrate. An electrical connection between a component and its associated substrate wiring in an MCM may be made in several ways. Common techniques in use today include wire bonding and reflow soldering.

Wire bonding is the same process used for bonding semiconductor connection pads to leadframe leads in conventional monolithic integrated circuit packages. Reflow soldering of MCM's is the same process used for surface mount boards.

One variation on the reflow theme is known as "flip-chip." In flip chip, as opposed to wire bonding, a semiconductor die's connection pads are plated with small bumps of solder as part of the wafer fabrication process. The wafer is diced as usual, to produce individual dice, or "chips." In building an MCM, a chip with solder bumps on its face is placed face down, (i.e. it is "flipped") and reflowed.

To make connections to the MCM, flex connectors are used. One such flex connector is described in U.S. patent application Ser. No. 08/423,595 assigned to Teradyne, Inc. A flex connector consists of a flex-circuit and some device to press conductive pads on the flex-circuit against conductive pads on the MCM.

Regardless of the specific interconnection used, it is highly desirable that all component-to-substrate connections made in the course of assembling components and substrate into an MCM be tested. They must be tested in order to assure the correctness of the completed assembly. Furthermore, failed connections must be diagnosed in order to provide information that can be used to improve the manufacturing process. Still further, components once placed and connected need to be checked, insofar as possible, to make sure that they are the right components.

Verifying components and component connections is the province of in-circuit testing. In-circuit testing, as noted earlier, requires that the test equipment be given electrical access to "nodes" in the circuit under test, and this access is provided by probes in a so-called "bed of nails" test fixture.

Various approaches are used to provide electrical access for testing. In some cases, test pads are added to the surface of the module. However, there are limitations in how small the test pads can be made. They must be big enough to ensure that all of the spring probes in the bed of nails reliably contact the test pads even though there will be some inaccuracy in the positioning of the spring probes in the fixture, the MCM in the fixture and the test pads on the MCM. Traditional test pads are at least 0.035" square to ensure that reliable contact is made with a bed of nails fixture. While the size of each test pad is relatively small, the total area taken up by all of the test pads on the MCM could be substantial. If pads are 0.035" square and each is separated from any other circuit area by 0.010", each pad occupies more than 0.002 square inch. Five hundred such pads, which is a typical number for a MCM, will occupy over one square inch. Using so much space is undesirable in an MCM which has, as one of its primary advantages, a size reduction.

One approach to using less space for test pads is to simply use fewer test pads. Fewer test pads could result in less thorough testing of the MCM. However, reduced test is often undesirable. A better solution would be to keep all the test pads, but find an acceptable way to make the pads smaller. Smaller pads would consume less of the available board area.

We have identified that conventional fixturing requires such large test pads because the materials, designs and manufacturing processes used in building conventional bed of nails fixtures bring about large uncertainties in the positions of the test probes relative to the true positions of the test pads. Conventional fixtures are made by drilling holes in a block of insulating material and press-fitting tubular sockets into the drilled holes. Spring probes are then installed in the sockets. A pair of tooling pins, also press-fitted into holes drilled into the block, serve as guiding posts to align holes in the board-under-test to the block. Thus, through a chain of mechanical connections of various degrees of precision, the board's test pads are aligned with the distal ends of the spring probes.

Lack of precision results from several sources. The insulating block holding the spring probes in the fixture might not be homogeneous, which will cause the drill bit to wander as it hits harder or softer places. This is especially serious with fiber-reinforced materials such as the commonly used FR-4/G-10.

Alternatively, the insulating block may have residual stresses from its own manufacture that are irregularly released when the holes are drilled. This results in random displacements of the holes.

If the insulating material in the fixture has a thermal expansion characteristic that differs from that of the circuit board or MCM substrate being tested, further errors might arise.

Errors also arise because positions of holes drilled in a block are dimensioned with reference to a single datum, so errors with respect to true position will tend to worsen with distance from that datum;

Positioning of the spring pins can also cause errors. The press-fitted tubular sockets may be thrown out of true, and may come to rest at slight angles in the course of being force-fitted. Errors are also introduced because the spring probes inserted into the sockets are deliberately designed with a considerable amount of radial play, in order to accommodate accumulating dirt during their service lives.

Other parts of the fixture also contribute to the errors. The tooling pins must be deliberately undersized to avoid binding with the holes in the board under test. The entire fixture assembly might also flex in unpredictable ways when it is forced into contact with the board under test.

These factors all contribute to errors in the true positions of probe tips in a conventional test fixture. The pads on the board under test must therefore be made large in order to guarantee contact by the probes in the fixture.

It would be highly desirable to be able to thoroughly and quickly test a MCM. It would be highly desirable if good test access were provided without significantly increasing the size of the MCM.

SUMMARY OF THE INVENTION

With the foregoing background in mind, it is an object of the invention to provide good test access on an MCM.

It is also an object to provide good test access on an MCM without increasing the size of the MCM.

It is a further object to reduce many of the sources of probe position inaccuracy and thereby allow smaller test pads to be used.

The foregoing and other objects are achieved by fabricating arrays of test points on an electronic assembly. Test probe alignment features are incorporated onto the assembly. Each group of test points is contacted by a small pitch set of probes from a test fixture.

In a preferred embodiment, the sets of test probes are independently positionable. Each array of test points has one of the probe alignment features associated with it and positions one set of test probes relative to each array of test points.

In a preferred embodiment, each set of test points is fabricated on a flex-circuit.

In a preferred embodiment, the arrays of test points are fabricated around the perimeter of the assembly.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
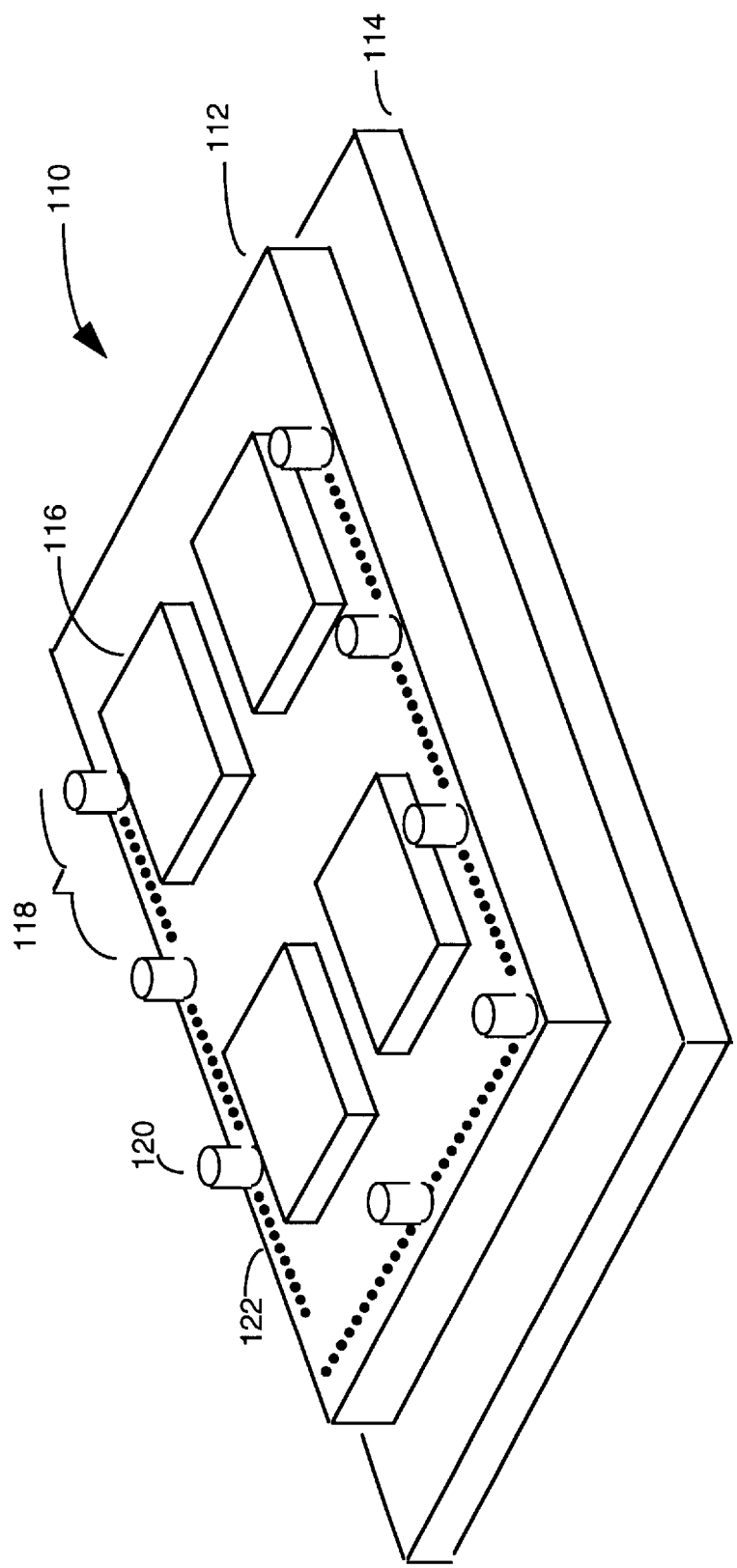
FIG. 1 is a simplified isometric view of a multi-chip module fabricated with test access according to the invention.

FIG. 1 shows a multi-chip module (MCM) 110 fabricated according to the invention. MCM 110 has an aluminum base plate 114 supporting a substrate 112. Substrate 112 is a multi-layer laminated substrate of the type typically used to make multi-chip modules. MCM 110 is made using construction techniques conventionally used to make laminate based multi-chip modules.

Several components 116 are attached to the upper surface (not numbered) of substrate 112. Any component attachment techniques could be used. Examples of suitable attachment techniques are surface mount, flip-chip, wirebond and SOIC. The separate components 116 are interconnected through conductive traces in substrate 112.

The upper surface (not numbered) of substrate 112 also includes several arrays of test points 118. Each array of test points 118 is made up of several test pads 122 formed on the upper surface of substrate 112. Test pads 122 are electrically connected to components 116 through conductive traces within substrate 112.

An alignment post 120 is positioned next to each array of test points 118. The spacing between the test pads 122 is fixed within each array 118. The positional relationship between each array of test points 118 and its corresponding alignment post 120 is also fixed. By fixing these positional relationships, alignment post 120 may be used to locate the test pads 122 within any array 118.

FIG. 1 shows ten test pads 122 within each array of test points 118. This number is shown for clarity of illustration only. In a preferred embodiment, sixty-four test pads are included in each array 118.

In a preferred embodiment, the upper surface of substrate 112 is approximately 5x6 inches. Each test pad 122 has a diameter of approximately 0.020 inches. Test pads 122 within each array are spaced by approximately 0.030 inches on center. Alignment post 120 has a diameter of approximately 0.10 inches. In this way, 640 test pads can be disposed around the perimeter of MCM 110.

FIG. 1 shows that the arrays of test pads 118 are positioned around the perimeter of substrate 112. This positioning allows easy access to the test pads 122. Preferably, the arrays are positioned within about 0.10 inch of the edge of the substrate. This positioning ensures that a very small part of MCM 110 is occupied with test pads.

Figure 2:
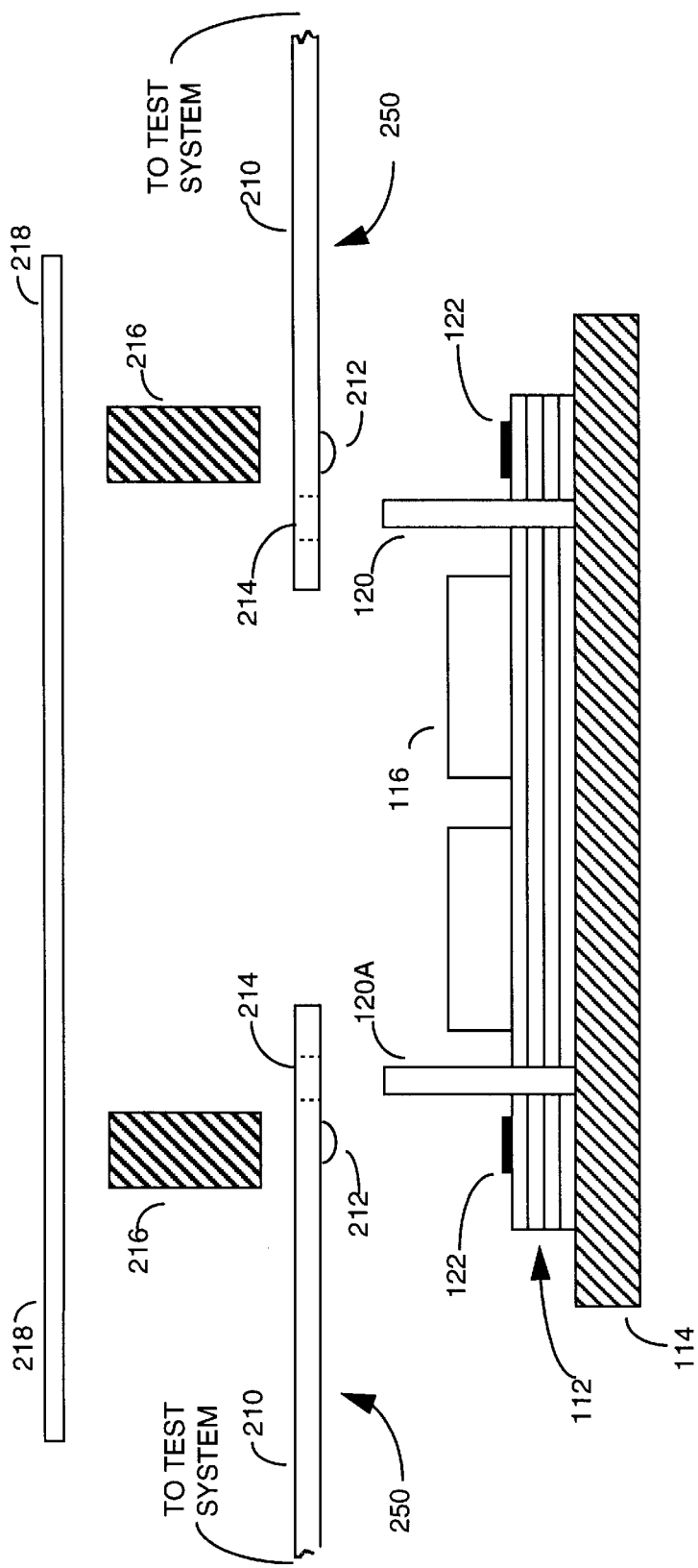
FIG. 2 is a simplified cross sectional view of the multichhip module of FIG. 1 in a test fixture adapted to take advantage of the test access features of the invention.

Turning now to FIG. 2, MCM 110 is shown in cross section in conjunction with a plurality of multi-point probes 250. Each multi-point probe 250 contains a flex circuit 210. Flex circuit 210 is a flex circuit of the type used to make flex connectors. It contains numerous conductive traces (not shown). Each conductive trace ends in a contact 212 on an under surface (not numbered) of flex circuit 210.

Each flex circuit 120 contains an alignment hole 214. Contacts 212 have the same positional relationship to alignment hole 214 as test pads 122 within one array 118 have to an alignment post 120 associated with that array. Contacts 212 are spaced with the same spacing as test pads 122. In this way, each contact 212 is aligned with and makes contact with a test pad 122. Each multi-point probe makes contact with all of the test pads 122 within one array 118.

Contacts 212 have, in a preferred embodiment, a diameter of 0.15 inches. Contacts 212 are preferably particle bump type contacts. A particle bump type contact is made by depositing silicon carbide or other hard, particulate on a contact pad. The particulate is then coated with a layer of metal. Such pads are desirable because they provide good electrical contact with low force.

Particle bump type contact are used in some flex-connectors because they reduce the need for "swipe." Metal surfaces can become coated with a nonconductive layer, such as of metal oxide or dirt. Most electrical connectors bring the metal surfaces intended to make electrical contact together with a swiping motion. This motion removes the surface layer and ensures electrical contact. The particles of the particle bump type contact can pierce the surface layer without swipe. For that reason, the particle bump type contacts are well suited for making a probe, though they are made using a known process.

The other end of the conductive traces are connected to a test system (not shown) in the same way that each of the spring pins in a conventional bed of nails fixture is connected to a test in the prior art. A suitable tester system is a Z1800 board test system sold by Teradyne, Inc. of Walnut Creek, Calif., USA. The tester generates and measures test signals at each of the nodes on MCM 110 through the test pads 122.

To ensure good electrical contact, elastomer blocks 216 are attached to the upper surface of flex circuit 210. Pressure plate 218 is positioned above elastomer blocks 218. In use, a downward force is applied on pressure plate 218. Pressure plate 218 compresses elastomer blocks 216 against flex circuits 210, ensuring that contacts 212 are firmly pressed against test pads 122.

The downward force on pressure plate 218 is provided in any convenient means. In a preferred embodiment, MCM 110 is mounted in a fixture for testing, as in a conventional test system. The force might be generated by an over-clamp mechanism in the fixture. The force could alternatively be generated by a vacuum fixture, as in the prior art.

It should be appreciated that the flex circuits 210 are flexible. They can be independently moved to align with the test pads 122 in each array 118. In this way, it is only necessary for the positional tolerances between the test pads 122 and corresponding alignment post in one array of test points 118. If there are inaccuracies in the positioning of one array of test points 118 relative to the others, flex circuit 210 will adjust for this inaccuracy.

It is easier to maintain high positional tolerances over a small area than a large area. In the preferred embodiment, each array of test points is less than 2 inches long. High positional tolerances can be maintained over this relatively small distance. Therefore, test pads 122 do not need to be made as large to account for this tolerance. The invention allows smaller test pads to be used, thereby providing many test points in a very small area.

Having described one embodiment, numerous alternative embodiments or variations might be made. For example, FIG. 1 shows a single alignment post 120 used for each array of test points 118. The number and placement of alignment posts could be varied. For example, one alignment post could be placed between two arrays, allowing the same alignment post to be used to locate test pads in both arrays.

Alternatively, two alignment posts might be used for each array of test points, allowing the probe to be located with two degrees of freedom.

While desirable to position the test pads at the periphery of the MCM, is not necessary that they be so positioned. However, if the test pads are near the center of the MCM, it is necessary that the multi-point probe be configured to clear the components on the MCM.

Another variation which might be desirable is in the shape of the alignment posts. The posts might preferably be tapered. In this way, the upper portion of the post has a smaller diameter, making it easier to insert it into hole 214.

Also, FIG. 1 shows that arrays 118 are linear arrays of test points. It is not necessary that the arrays be linear. Two rows of test points might be included to make a two dimensional array. Of course, a circular array might be used, or arrays of other shapes could be used.

It is also not necessary that the test points be in a regular array, i.e. an array in which the spacing between each test point is the same. It is only necessary that the position of each test pad 122 relative to the alignment post 120 is known and matches the spacing of a contact 212 relative to alignment hole 214.

It is also not necessary that each array of test points 118 be identical. While having each array identical can provide manufacturing simplification, it is not required to gain advantages of the invention.

Further, it is described that the multi-point probes 250 are made via contact pads on a flex circuit. Such circuits are well suited to meet the requirements of the invention. They provide an easy way to fix the position of the probe points, such as contact pads 212, relative to an alignment feature, such as hole 214. They also allow the probes to "float" relative to the fixture, i.e. they allow the probes to move independently relative to the fixture so that each probe can align with its array 118. However, other multi-point probes might be used.

For example, groups of conventional spring type contact probes might be held together on a metal bar. The metal bar might be attached to the fixture via a flexible bar or spring.

It is possible that different types of probes might be used together. For example, a multi-point flex circuit probe might be used to probe test points around the perimeter of the module. Such a probe might be used in conjunction with conventional spring type probes making contact with test points in the center of the module. Alternatively, the multi-point flex circuit probes might be used in conjunction with a "flying prober" to make contact with a small number of tst points in the center of the module. A flying prober is a test device that contains a few test points that move to make contact at multiple test points.

Also, it was described that each multi-point probe in the preferred embodiment contains sixty-four test points. The number of test points in each multi-point probe could have many other values. There could be as few as eight or ten points in each probe. Because each probe requires separate alignment means on MCM 110, it is desirable not to have too many small probes because of the space taken up by the alignment means. On the other hand, if there are too many test points in each probe, the area covered by the array of test points is too large to maintain tight tolerances. Extra space is taken up by the larger test pads. Therefore, the advantages of the invention can best be obtained if the number of test points in each array is between 8 and 256. More likely, it will be between 32 and 128. However, advantage can be obtained from the invention even if different sized test probes are used.

Moreover, it is not necessary that the alignment means be limited to a post and a hole as shown. It will be appreciated that the position of the post and hole could be reversed, with the post on the flex circuit and the hole in the substrate if the MCM.

Alternatively, alignment features with different shapes might be used. For example, a ridge on the multi-point probe might engage the edge of the substrate. A tab extending from the ridge might engage a slot on the substrate to provide lateral positioning. In that case, the arrays of test points would need to have a fixed position relative to the edge and the slot. As an example of another variation, a notch might be used in place of a hole. Other mechanical devices and features to position the two objects could be used.

It is also not, however, necessary that the alignment means be limited to physical features. Vision systems are sometimes used in conjunction with an X-Y or robotic manipulator to align two objects. Such systems could be used in this case. In that case, the alignment means associated with the test arrays would be markings on the MCM observable to the vision system.

It should also be appreciated that alternative dimensions might be used. For example, in the preferred embodiment, the arrays of test points were disposed within 0.1 inches of the edge of a module measuring approximately five inches on a side. These dimensions define a perimeter area of about 4% by length of each edge. The perimeter area is preferably small. Ideally, it will be less than 10% by length of each edge of the module.

Moreover, FIG. 1 shows a single sided MCM, with components on only a single surface. It is possible that test points might be fabricated on two sides of substrate 112. It is also possible that two substrates might be mounted to opposite sides of base 114. In either of these situations, probes could be placed to access test points from two different directions simultaneously.

It should also be noted that the preferred embodiment of the invention relates to testing multi-chip modules. However, the invention could be used for testing other types of assemblies. The invention is most useful for testing miniaturized assemblies, such as MCMs and surface mount printed circuit boards, but need not be so limited.

Therefore, the invention should be limited only by the spirit and scope of the appended claims.

What is claimed is:

1. A test system for circuit assemblies having a plurality of arrays of test points on a surface thereof, each array having associated therewith an alignment feature, the test system comprising:
    a) a fixture adapted to hold the circuit assembly; and
    b) a plurality of groups of probe contacts, with the contacts within each group having a predetermined relationship;
    c) means, for each of the plurality of groups of probe contacts, for mounting the groups of probe contacts relative to the fixture to allow the probe contacts to be independently positioned on said surface of the circuit assembly; and
    d) alignment means, associated with each of the plurality of groups of probe contacts, for independently positioning each of the groups of probe contacts relative to an alignment feature on the circuit assembly.

2. The test system of claim 1 wherein each group of probe contacts and the means for mounting comprises a flex circuit having a flexible first surface with a plurality of conductive traces with contacts disposed on the first surface.

3. The test system of claim 2 wherein the alignment means comprises a hole in the flex circuit.

4. The test system of claim 1 additionally comprising means for simultaneously applying force to each group of probe contacts.

5. The test system of claim 4 wherein the means for simultaneously applying force comprises a plate.

6. The test system of claim 1 additionally comprising electronic circuitry for generating and measuring test signals and wherein each group of probe contacts is connected to the electronic circuitry.

7. The test system of claim 1 wherein the plurality of groups of probes comprises at least 2 groups of probe contacts.

8. The test system of claim 7 wherein each group of probe contacts comprises between 32 and 128 probe contacts.

9. The test system of claim 8 wherein the circuit assembly has a perimeter area taking up no more than 10% by length of the circuit assembly and the plurality of test points are disposed in the perimeter area.

10. A method of manufacturing multi-chip modules using the test system of claim 1, the method comprising testing according to the steps of:

a) inserting the multi-chip module into the fixture;

b) aligning each of the plurality of groups of probe contacts with an array of test points on the multi-chip module; and c) applying and measuring test signals at selected ones of the probe points to determine whether the multi-chip module is operating correctly.

11. The method of claim 10 wherein the step of aligning includes applying pressure to the multi-point probes.

12. The method of claim 11 wherein the step of applying pressure comprises drawing a vacuum through the fixture.

13. The method of claim 11 wherein the step of applying pressure comprises pressing on a plate mechanically coupled to each of the plurality of multi-point probes.

14. The method of claim 13 wherein the plate is mechanically coupled to the plurality of groups of probe contacts through an elastomeric material.

15. A test system for circuit assemblies comprising:

a) a fixture;

b) a circuit assembly, positioned in the fixture, having:
   i) a substrate with a first surface;
   ii) a plurality of components attached to the first surface; and
   iii) a plurality of test points disposed in a plurality of arrays on the first surface of the substrate;

c) a plurality of probes, coupled to the test fixture, each probe having a plurality of contacts disposed in a pattern matching the pattern of the test points in a corresponding one of the plurality of arrays, each of the plurality of probes being independently positionable on the first surface; and d) means for independently aligning each of the plurality of probes with the corresponding one of the plurality of arrays.

16. The test system of claim 15 wherein each of the plurality of test points comprises a conductive pad on the first surface of the substrate, the conductive pad having a diameter less than 0.02 inches.

17. A test system for circuit assemblies comprising:

a) a fixture;

b) a circuit assembly positioned in the fixture, having:
   i) a substrate with a first surface; and
   ii) a plurality of test points disposed in a plurality of arrays on the first surface of the substrate;

c) a plurality of probes, coupled to the fixture, each probe having a plurality of contacts disposed in a pattern matching the pattern of the test points in a corresponding one of the plurality of arrays, each of the plurality of probes being independently positionable on the first surface; and d) means for aligning each of the plurality of probes with the corresponding one of the plurality of arrays, wherein the means for aligning comprises:
   i) a plurality of posts attached to the substrate, each post having a predetermined positional relationship with one of the plurality of arrays; and
   ii) a hole in each of the plurality of probes, each hole having the same predetermined positional relationship with the plurality of contacts of the probe.

* * * * *